United States Patent
Miyasaka

(10) Patent No.: US 8,893,538 B2
(45) Date of Patent: Nov. 25, 2014

(54) INSTANTANEOUS HEAT TREATMENT METHOD FOR METAL PRODUCT

(75) Inventor: Yoshio Miyasaka, Aichi (JP)

(73) Assignee: Fuji Kihan Co., Ltd., Aichi (JP)

( * ) Notice: Subject to any disclaimer, the term of this patent is extended or adjusted under 35 U.S.C. 154(b) by 623 days.

(21) Appl. No.: 13/293,693

(22) Filed: Nov. 10, 2011

(65) Prior Publication Data

US 2012/0144890 A1     Jun. 14, 2012

(30) Foreign Application Priority Data

Dec. 8, 2010   (JP) ................................ 2010-274000

(51) Int. Cl.
| | | |
|---|---|---|
| *C21D 7/06* | (2006.01) | |
| *C22F 1/04* | (2006.01) | |
| *C21D 7/00* | (2006.01) | |

(52) U.S. Cl.
CPC ... *C21D 7/06* (2013.01); *C22F 1/04* (2013.01); *C21D 7/00* (2013.01)
USPC .............................................. 72/53; 29/90.7

(58) Field of Classification Search
USPC .............................................. 72/53; 29/90.7
See application file for complete search history.

(56) References Cited

U.S. PATENT DOCUMENTS

| | | | |
|---|---|---|---|
| 5,592,840 A | 1/1997 | Miyasaka | |
| 5,596,912 A * | 1/1997 | Laurence et al. | ................. 72/53 |
| 6,449,998 B1 * | 9/2002 | Takeda et al. | .................... 72/53 |
| 2010/0132177 A1 * | 6/2010 | Thummler | .................... 29/90.7 |

FOREIGN PATENT DOCUMENTS

| | | |
|---|---|---|
| EP | 0731181 A1 | 9/1996 |
| EP | 0962539 A1 | 12/1999 |
| EP | 2135969 A1 | 12/2009 |
| JP | 07-188738 | 7/1995 |

OTHER PUBLICATIONS

European Search Report dated Apr. 4, 2012.
Briere T A ED-John S. Eckersley et al; "Shot Blasting Systems" (Jan. 1, 1992), Shot Peening ; Theory and Application, Gournay-Sur-Marne; IITT-Internation FR, pp. 167-189, XP008137949, ISBN: 2-907669-18-4; pp. 171-173.

* cited by examiner

*Primary Examiner* — Teresa M Ekiert
(74) *Attorney, Agent, or Firm* — Cooper Legal Group, LLC

(57) ABSTRACT

Uniform nano-scale microstructures can be reliably formed on the surface layer of this metal product while still improving the surface roughness and make the surface layer robust enough not to disappear due to wear. The surface of the metal product is repeatedly subjected to instantaneous rapid heating and rapid cooling by intermittently ejecting onto the surface of the metal product shot with a mixture of three or more approximate but different particle sizes for a high ejection density, thereby forming uniform microstructures near the surface of the metal product and forming micro-diameter dimples in the metal surface.

10 Claims, 6 Drawing Sheets

0.1μm  5μm

INITIAL AFFINITY
TAKES
SHORT TIME

INITIAL AFFINITY TAKES LONG TIME

INSTANTANEOUS HEAT TREATMENT METHOD FOR METAL PRODUCT

BACKGROUND OF THE INVENTION

1. Field of the Invention

The present invention relates to surface treatment applied to the surfaces of metal products such as tools and mechanical parts. More particularly, the present invention relates to an instantaneous heat treatment method for metal products, in which the surface of a metal product is repeatedly subjected to instantaneous rapid heating and rapid cooling by intermittently ejecting abrasive (referred to as "shot" in this description) with a mixture of three or more approximate but different particle sizes for high ejection density onto the surface of the metal product, thereby achieving both effects of forming uniform microstructures near the surface of the metal product and forming micro-diameter dimples on the metal surface.

In the description, the term "particle size" refers to a range of average particle diameter.

2. Description of the Related Art

In general, various types of surface treatment processes are employed in order to endow the surface of a metal product with intended properties.

In particular, among various metal products, in order to prevent wear on sliding portions, drive portions, and seal portions of metal products which are prone to severe wear, as well as cutting tools and molds which are especially prone to wear, the hardness of the material of such metal products has been conventionally increased by heat treatment processes, such as quenching, carburization, and nitriding. Alternatively, the surface roughness of such metal products has been conventionally improved by machining, such as cutting, grinding, and polishing with a machine tool such as a lathe or a milling machine. Moreover, an oil film has been formed on the surface at a sliding portion etc. of a metal product by an oil supply process such as an oil bath process, splash process, drop process, cycling process or spray process in order to prevent wear at the sliding portion etc., and various advances have been made including a method for effectively forming an oil film on the surface of a metal product based on these oil supply processes and a method for improving the quality of lubricating oil to prevent the oil film from running out.

Miniaturization of Metal Structures

In comparison with surface heat treatment for achieving high hardness of the surface of a metal product by the above-described known quenching method, an instantaneous heat treatment method has recently been proposed involving miniaturizing structures in the surface of a metal product by instantaneously applying rapid heating and rapid cooling to the surface of the metal product, thereby dramatically increasing the mechanical strength of the metal product. Metal deformation is caused by dislocation, and it is well-known that the smaller the metal crystal grains are, the harder the metal becomes because such dislocation is restricted due to an increased number of crystal grain boundaries as a result of the miniaturization.

Pulse quenching has been proposed as the above-described instantaneous heat treatment method applied to a metal surface. Because this pulse quenching heats a thin surface layer up to the austenitizing (γ) temperature in a very short period of time (on the order of ms) and subsequently removes the heat by means of the surrounding materials, rapid cooling can be achieved without having to use a specific coolant, thereby producing an extremely fine, hardened structure. In addition to this effect, it has also been found that microstructures can be obtained through phase transformation of locally melted portions being subjected to rapid solidification with friction heat arising from lubricated friction carried out using cast iron. Furthermore, it has been found that laser heat treatment can produce a uniform, fine martensite structure due to its heating/cooling process featuring rapid heating and rapid cooling. It has also been proposed that crystal grains be miniaturized by high-frequency quenching in which rapid heating is performed for two seconds at 950 to 1,000° C. by high-frequency induction heating, followed by rapid cooling.

In addition to instantaneous heat treatment by the above-described pulse quenching method, a method of ejecting shot onto the surface of a metal product to instantly heat the metal surface by collision of the shot and nanosizing of structures in the metal surface due to a self-quenching effect down to the room temperature is a well-known instantaneous heat treatment for miniaturizing structures in the surface layer of a metal product.

It has been found that pure iron changes to nano-crystals with a crystal grain diameter of 100 nm or smaller at depths of several μm to several tens of μm from the surface by applying shot peening treatment to pure iron under shot conditions with a particle diameter of 50 μm, an ejection speed of 190 m per second, and a treatment time of 10 seconds. It has been found that a nano-crystal structure is generated adjacent to the surface of carburized-quenched steel JIS-SCr420 by ejecting SKH59 particles with an average particle diameter of 45 μm onto the steel for 30 seconds at an air pressure of 0.5 MPa.

It has also been found that nano-crystals are formed adjacent to the surface of pure iron by ejecting shot with a particle diameter of 50 μm onto the pure iron for a treatment time of 100 seconds at an air pressure of 0.8 MPa.

Dimple Formation

Furthermore, the above-described surface treatment by ejecting shot is employed as a method of effectively forming an oil film on the surface of the metal product for the purpose of wear prevention. In more detail, a method has been proposed for preventing wear at a sliding portion of a metal product, in which substantially spherical shot having a hardness equal to or higher than the hardness of the metal product is ejected onto the surface at a sliding portion of the metal product and oil reservoirs (micropools) composed of numerous fine concavities (dimples) substantially arc-shaped in cross section are formed on the surface at the sliding portion of this metal product to prevent an oil film from easily running out (Japanese Patent No. 3212433).

It is also known that, in addition to the above-described effects of miniaturizing crystal structures and forming dimples, shot peening offers the effects of hardening the surface of a metal product, increasing the fatigue strength and so forth, because compressive residual stress is generated resulting from plastic deformation due to collision when shot is ejected onto the surface of the metal product.

Besides the above-described processes, surface treatment processes for qualitatively improving the surface of a metal product include mirror finishing that endows raw metal with abrasion resistance. Furthermore, plating and ceramic coating are performed to offer oxidation resistance, heat resistance, abrasion resistance, and corrosion resistance. Recently, ceramic coating by PVD or CVD, DLC coating and so forth are performed following surface finishing.

Unfortunately, the known ('2433) surface treatment process has the following problems associated with the above-described sliding portions, drive portions, and seal portions of metal products, which severely deteriorate due to wear, and with cutting tools and molds, which are easily worn metal products.

Sliding portions of metal products suffer from a problem in that mirror finishing for the purpose of decreasing the sliding resistance causes wringing (phenomenon in which mirror surfaces adhere to each other) due to running out of an oil film and generates high resistance, leading to a knocking sound. The term wringing indicates a phenomenon in which two end surfaces in the form of smooth flat surfaces facing each other of products such as block gages, cannot be easily separated from each other when they are pressed against each other while being slid.

What is worse, even if an attempt is made to provide a lubrication effect with oil reservoirs (micropool effect) by forming fine (micro) dimples by ejecting shot as described above, in order to effectively form an oil film on the surface at a sliding portion of a metal product, it is difficult to form such an oil film due to an increase in the sliding speed or a decrease in oil viscosity, which is intended for achieving high fuel efficiency for the purpose of saving energy.

It is becoming possible to increase the strength of drive portions of metal products, for example, through carburization/quenching, followed by shot peening. However, because of the above-described demand for high fuel efficiency, the oil viscosity is decreased, which makes it difficult to form an oil film, causing serious problems including a decrease in the service life and generation of sound and vibrations.

In the case of seal portions of metal products, especially when two faces in contact with each other perform rotational or reciprocal motion in order to form a seal face, the seal face composed of the two faces in contact with each other requires hermeticity and responsiveness in order to prevent liquid and air from leaking Crevice corrosion prevention is required for threaded portions and metal-to-metal contact portions. Conventionally, the two faces constituting the above-described seal face are subjected to mirror finishing and, in some cases, plating or coating following this mirror finishing. However, mirror finishing is problematic because it causes wringing which decreases the responsiveness between the two faces constituting the seal face thereby generating sound. There are also problems with threaded portions or metal-to-metal contact portions in that screws cannot be untightened due to crevice corrosion, valves cannot be opened due to rust or even if they are opened, they cannot be closed.

In the case of cutting tools, there are growing demands for the use of water-soluble cutting oil, decreased usage amount of such cutting oil, or even use of dry processing for environmental reasons. These demands, however, lead to a decrease in the service life of cutting tools. On the other hand, molds are required to become lighter to increase fuel efficiency. For this reason, steel plates endowed with higher strength in a cooling step by adding manganese or silicon to iron, so-called high-tension materials are being used in larger amounts, further decreasing the service life of molds. In any case, a ceramic coating is generally applied, but a satisfactory solution cannot be achieved by coating alone, due partially to the problem of coating delamination.

Miniaturization of Metal Structure

The above-described instantaneous heat treatment method for miniaturizing metal structures by heat treatment has the following problems associated with it.

First, surface heat treatment by pulse quenching is suitable for some types of steel but not for others and is thus feasible only for limited applications. For example, high-frequency surface hardening is used mainly for carbon steel but adversely affects stainless steel. Laser quenching is also limited to special types of parts.

In contrast, heat treatment by shot blasting can be applied to any types of steel. Although it succeeds in forming nano-structures, heat treatment by shot blasting damages the surface of the product to be treated depending on the treatment conditions if the product is soft, thus the product cannot be placed into practical use. Another problem with heat treatment by blasting is that the entire treated surface layer cannot be nano-structured.

Although a method of forming nano-crystals on the surface layer of carburized-quenched steel JIS-SCr420 having relatively high hardness by shot peening has also proposed, it cannot enhance the mechanical properties such as the strength (tensile strength and yield point) and the toughness (stretch, drawing, and impact value), because the crystal grains are not uniform at a depth of 0.5 μm from the surface.

On the other hand, decreased oil viscosity in order to achieve high fuel efficiency as described above, may cause an oil film to run out even though oil reservoirs in the form of concavities are formed on the surface of a metal product by the known shot blasting disclosed in '2433, thus resulting in wringing, decreased service life, sound, and vibrations. It is known that faces sliding on each other are subjected to severe wear in an early stage (hereinafter, referred to as "initial affinity"). The surface of a metal product treated by known shot blasting, due to the relatively high surface roughness thereof, requires an extended period of time for this initial affinity, and furthermore, causes a large change in size due to this initial affinity, decreasing the accuracy and efficiency.

In addition, although the structures in the surface layer of a metal product can also be miniaturized by the known shot ejection disclosed in '2433 (column [0017] of '2433), it has also been found that the known ejection is problematic in that the dimples whose shape are distorted due to wear, disappear over time because this microstructure at the surface layer is not satisfactorily uniform and is not robust in some cases, thus making it impossible to maintain the oil film.

SUMMARY OF THE INVENTION

In light of this, the present invention has been conceived to solve problems or shortcomings associated with the above-described known techniques. The process is simple: shot with a mixture of three or more approximate particle sizes having a hardness equal to or higher than that of the metal product to be treated is intermittently ejected onto the surface of the metal product with a high ejection density. As a result, uniform nano-scale microstructures can be reliably formed on the surface layer of this metal product, while still improving the surface roughness. Furthermore, numerous micro-concavities in various sizes from relatively large ones to small ones and robust enough not to disappear due to wear (hereinafter, referred to as "mixed micro-dimples") can be randomly formed on the surface of this metal product. Thereby, the present invention is intended to provide an instantaneous heat treatment method in which the accuracy and efficiency are enhanced by decreasing the time required for the initial affinity; oil retention ability is enhanced by the capillary action of particularly small micro-dimples from among the above-described mixed micro-dimples, preventing an oil film from running out for an extended period of time; and the effects of dramatically extending the service life of the metal product, preventing wringing from occurring, and so forth can be afforded.

Means for solving the problems will now be described together with the terms used in the description of the embodiments. These are intended to clarify the correspondence between the descriptions in Claims and the descriptions in the embodiments and examples of the present invention, and it is needless to say that these are not restrictively used to interpret the technical scope of the claims of the present invention.

In order to achieve the above-described objects, an instantaneous heat treatment method according to the present invention is characterized by mixing substantially perfectly spherical shot with three or more approximate but different particle sizes within a range of (JIS R6001) #100 to #800 (average particle diameter: 149 μm to 20 μm), preferably a range of #280 (#320, #360, #400) to #500 (average particle diameter: 73.5 μm to 31 μm) as abrasives, the shot having a hardness higher than the hardness of a base metal of a workpiece; and intermittently ejecting the shot in the form of a fluid mixed with compressed air onto the workpiece in a barrel rotating at a rotational speed of 4.8 rpm for a period of 0.1 seconds to 1 second, at an ejection pressure of 0.3 MPa to 0.6 MPa, at an ejection speed of 100 to 200 m/sec, and at an ejection distance of 100 mm to 250 mm. In other words, 0.1 seconds to 1 second or less of ejection is repeated at intervals of preferably 0.5 seconds to 5 seconds to randomly form, in the surface of the workpiece, numerous micro-concavities of 0.1 μm to 5 μm in diameter having a substantially circular bottom surface.

It is preferable that the above-described intermittent ejection be performed at intervals of at least 0.5 seconds to 1 second.

Although the higher the shot sphericity, the more effectively the intended purpose can be achieved, it is sufficient if the shot is substantially perfectly spherical.

Regarding the ejection pressure and the ejection distance, the ejection speed can be efficiently achieved using shot with the above-described particle sizes. The workpiece can be formed to have a surface roughness (Ra; JIS B0601: 1982, 1994, 2001; arithmetic average roughness) of 1 μm or less. Ra is a value calculated by sampling a standard length "1" from a roughness curve in a direction of an average line of the roughness curve, then adding up and averaging out absolute values of deviations from the sampled part of the average line to a measuring curve. Ra is determined by the following expression:

$$Ra = \frac{1}{l}\int_0^l |f(x)|dx$$

Regarding the ejection pressure and the ejection distance, the ejection speed can be efficiently achieved by using shot with the above-described three approximate particle sizes.

Furthermore, the shot with three or more approximate but different particle sizes should preferably have a shot mixing ratio of 1:1:1.

According to the above-described instantaneous heat treatment method, the temperature of the surface layer at the sliding portion of the metal product instantaneously increases due to an impact force with high ejection density of shot with a mixture of three or more different particle sizes, even with ejection of one second or less. As a result, numerous micro-concavities in various sizes from relatively large ones to small ones are randomly formed in the surface at the sliding portion (mixed micro-dimples). The heated metal surface is instantaneously cooled while non-ejection interval, miniaturizing the structures in the surface layer down to the nano-size level, and furthermore, the metal surface comes to have a structure with high internal stress, high hardness, and high toughness, due to the formation of the above-described concavities. Furthermore, the entire treated surface is repeatedly subjected to instantaneously rapid heating and rapid cooling by repeating intermittent ejection with high ejection density, thereby uniformly miniaturizing the structures in the surface layer down to the nano-size level.

In addition, the above-described micro-concavities are formed to have a substantially circular bottom surface and a diameter of 0.1 μm to 5 μm. The treated product is formed to have a surface roughness (Ra) of 1 μm or less.

Therefore, because the metal structures in the surface of the metal product subjected to treatment according to the present invention are miniaturized more uniformly than conventionally, not only does this surface exhibit improved strength and toughness, superior abrasion resistance, and enhanced corrosion resistance, but also no crevice corrosion occurs.

In addition, as a result of treatment according to the present invention, numerous, fine, and random concavities (mixed micro-dimples) of various diameters and substantially arc-shaped in cross section are formed in the surface of the metal product, such that the concavities serve as pools for liquids, solids, and gases, as well as lubricants.

Because the workpiece is formed to have a surface roughness (Ra) of 1 μm or less, the initial affinity takes a shorter time, the size does not change significantly, the accuracy is higher, and the efficiency is higher compared to the conventional methods.

Because the bottom surfaces of the above-described concavities are substantially circular and have a diameter of 0.1 μm to 5 μm, not only do the mixed micro-dimples formed according to the present invention serve as pools for lubricants, solids, liquids, and gases but also the lubricating oil is more effectively maintained due to the capillary action of especially small micro-dimples from among the above-described mixed micro-dimples, thus preventing the oil film from running out. Furthermore, due to the labyrinth effect of the above-described mixed micro-dimples, the seal portion is free of leaks and wringing and therefore can be slid smoothly.

BRIEF DESCRIPTION OF THE DRAWINGS

The objects and advantages of the invention will become apparent from the following detailed description of preferred embodiments thereof provided in connection with the accompanying drawings in which.

DETAILED DESCRIPTION OF THE PREFERRED EMBODIMENTS

Figure 1:
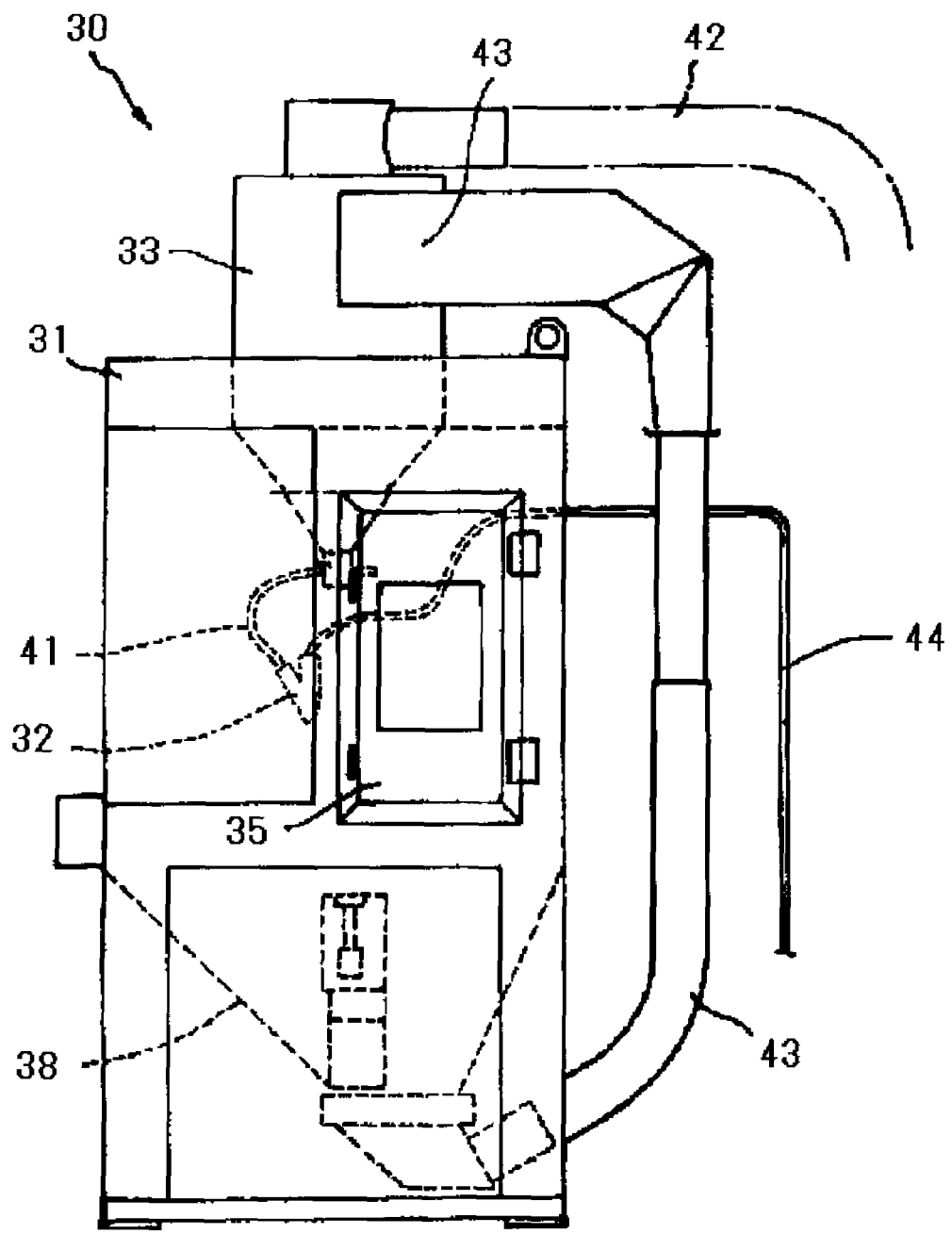
FIG. 1 shows the overall structure of a gravity blasting machine according to one Example of the present invention.

An instantaneous heat treatment method for metal products according to the present invention will now be described in detail.

Ejector

In the instantaneous heat treatment method according to the present invention, shot is ejected onto the surface of a metal product using a known blasting machine.

Various types of air blasting machine are available, including, for example, a direct-pressure blasting machine that supplies compressed air into a tank containing shot, causes the shot transported by this compressed air to ride on a flow of separately supplied compressed air, and ejects them via a blasting gun; a gravity blasting machine that causes shot falling from a tank to ride on compressed air and ejects them; a suction blasting machine that sucks shot with negative pressure generated as a result of ejecting compressed air to eject the shot together with the compressed air; and so forth.

Shot

The shot used for the present invention has a hardness equal to or higher than that of the metal product to be treated and has a mixture of three or more approximate particle sizes within a range of JIS abrasive particle size from #100 to #800 (average particle diameter: 149 μm to 20 μm) according to the purpose. The term "approximate particle size" refers to a particle size within the above-described range.

Particle size distributions of the shot used in the present invention based on JIS R 6001 are shown in Table 1 and Table 2.

TABLE 2

Particle size distribution or fine powders based on a testing method using magnified photograph (JIS R 6001)
unit: μ

| Particle size | Average diameter of the largest particle | Average diameter of the 30th particle from the largest particle | Average of average diameters |
|---|---|---|---|
| #240 | 171 or less | 120 or less | 87.5 to 73.5 |
| #280 | 147 or less | 101 or less | 73.5 to 62 |
| #320 | 126 or less | 85 or less | 62 to 52.5 |
| #360 | 108 or less | 71 or less | 52.5 to 44 |
| #400 | 92 or less | 60 or less | 44 to 37 |
| #500 | 80 or less | 52 or less | 37 to 31 |
| #600 | 70 or less | 45 or less | 31 to 26 |
| #700 | 61 or less | 39 or less | 26 to 22 |
| #800 | 53 or less | 34 or less | 22 to 18 |
| #1000 | 44 or less | 29 or less | 18 to 14.5 |
| #1200 | 37 or less | 24 or less | 14.5 to 11.5 |
| #1500 | 31 or less | 20 or less | 11.5 to 8.9 |
| #2000 | 26 or less | 17 or less | 8.9 to 7.1 |
| #2500 | 22 or less | 14 or less | 7.1 to 5.9 |
| #3000 | 19 or less | 12 or less | 5.9 to 4.7 |

TABLE 1

Particle size distribution of coarse powders (JIS R 6001)

| Particle size | Standard sieve which should be passed through at 100% (One step) | Standard sieve on which powders may be remained up to a fixed amount and the remained amount of the powders (Two steps) | | Standard sieve on which powders may be remained more than a fixed amount and the remained amount of the powders (Three steps) | | Two standard sieves on which powders for the two sieves should be remained more than a fixed amount in total and the remained amount of the powders in total (Three steps + Four steps) | | | Standard sieve which may be passed through up to 3% at the maximum (Five steps) |
|---|---|---|---|---|---|---|---|---|---|
| | μ | μ | % | μ | % | μ | | % | μ |
| #8 | 4000 | 2830 | 15 | 2380 | 45 | 2380 | 2000 | 80 | 1680 |
| #10 | 3360 | 2380 | 15 | 2000 | 45 | 2000 | 1680 | 80 | 1410 |
| #12 | 2830 | 2000 | 15 | 1680 | 45 | 1680 | 1410 | 80 | 1190 |
| #14 | 2380 | 1680 | 15 | 1410 | 45 | 1410 | 1190 | 80 | 1000 |
| #16 | 2000 | 1410 | 15 | 1190 | 45 | 1190 | 1000 | 80 | 840 |
| #20 | 1690 | 1190 | 15 | 1000 | 45 | 1000 | 840 | 80 | 710 |
| #24 | 1190 | 840 | 25 | 710 | 45 | 710 | 590 | 70 | 500 |
| #30 | 1000 | 710 | 25 | 590 | 45 | 590 | 500 | 70 | 420 |
| #36 | 840 | 590 | 25 | 500 | 45 | 500 | 420 | 70 | 350 |
| #46 | 590 | 420 | 30 | 350 | 40 | 350 | 297 | 65 | 250 |
| #54 | 500 | 350 | 30 | 297 | 40 | 297 | 259 | 65 | 210 |
| #60 | 420 | 297 | 30 | 250 | 40 | 250 | 210 | 65 | 177 |
| #70 | 350 | 250 | 25 | 210 | 40 | 210 | 177 | 65 | 149 |
| #80 | 297 | 210 | 25 | 177 | 40 | 177 | 149 | 65 | 125 |
| #90 | 250 | 177 | 20 | 149 | 40 | 149 | 125 | 65 | 105 |
| #100 | 210 | 149 | 20 | 125 | 40 | 125 | 105 | 65 | 74 |
| #120 | 177 | 125 | 20 | 105 | 40 | 105 | 88 | 65 | 63 |
| #150 | 149 | 105 | 15 | 74 | 40 | 74 | 63 | 65 | 44 |
| #180 | 125 | 88 | 15 | 63 | 40 | 63 | 53 | 65 | — |
| #220 | 105 | 74 | 15 | 53 | 40 | 53 | 44 | 60 | — |

Moreover, details of shots used in the present invention are shown in Table 3-1 and Table 3-2.

TABLE 3-1

Quality standard of ceramic system beads

| Shot | Shape | Mesh size | Average diameter (μm) | Average diameter of the 30th particle from the largest particle (μm) | Specific gravity (g/cc) | Mohs hardness |
|---|---|---|---|---|---|---|
| Glass beads FGB | Sphere | #80 | 250 to 177 | — | 2.46 | 6.0 |
| | | #100 | 177 to 149 | — | | |
| | | #120 | 149 to 125 | — | | |
| | | #150 | 125 to 105 | — | | |
| | | #180 | 105 to 88 | — | | |
| | | #200 | 88 to 74 | — | | |
| | | #300 | 62 to 53 | 85 or less | | |
| | | #400 | 53 or less | 60 or less | | |
| | | #600 | 44 or less | 45 or less | | |
| Hard beads FHB | Sphere | #100 | 180 to 125 | — | 2.60 | 7.5 |
| | | #120 | 150 to 106 | — | | |
| | | #150 | 125 to 40 | — | | |
| | | #180 | 106 to 75 | — | | |
| | | #200 | 90 to 63 | — | | |
| | | #300 | 63 to 45 | 85 or less | | |
| | | #400 | 53 to 38 | 60 or less | | |

Components (Reference value)

| Shot | $SiO_2$ | $Al_2O_3$ | $B_2O_3$ | $Na_2O$ | $K_2O$ | CaO | MgO |
|---|---|---|---|---|---|---|---|
| Glass beads FGB | 72 | 2 | — | 13 | | 9 | 3 |
| Hard beads FHB | 54 | 14 | 8 | 0.5 | | 22 | 1 |

TABLE 3-2

Quality standard of metal beads

| Shot | Material | Shape | Mesh size | Average diameter (μm) | Average diameter of the 30th particle from the largest particle (μm) | Density g/cm³ | Bulk specific density | Hardness (HV0.5) 90% or more |
|---|---|---|---|---|---|---|---|---|
| Steel beads FSS | Cast iron | Sphere | #50 | 350 to 177 | — | 7.5 to 7.6 | 4.1 to 4.5 | 700 to 800 (HRC 60 to 64) |
| | | | #80 | 250 to 105 | — | | | |
| | | | #150 | 125 to 44 | — | | | |
| | | | #300 | 74 to 37 | 101 or less | | | |
| Stainless beads SUS-304 | Stainless steel | Sphere | #50 | 350 to 177 | — | 7.5 to 7.6 | 4.1 to 4.5 | 400 to 600 (HRC 40 to 55) |
| | | | #80 | 250 to 105 | — | | | |
| | | | #150 | 125 to 44 | — | | | |
| | | | #300 | 74 to 37 | 101 or less | | | |
| High speed beads FHS | high-speed casting steel | Sphere | #300 | 74 to 37 | 101 or less | 8.0 to 8.1 | 4.8 to 5.0 | 900 to 1100 (HRC 67 to 70) |
| | | | #400 | 53 to 30 | 60 or less | | | |

Components

| Shot | C | Si | Mn | P | S | Cr | Ni | Mo | V | W | Co | Fe |
|---|---|---|---|---|---|---|---|---|---|---|---|---|
| Steel beads FSS | 0.9 to 1.1% | <1.3% | <1.0% | <0.05% | <0.05% | | | | | | | BAL |
| Stainless beads SUS-304 | 0.2 to 0.3% | <1.3% | <1.0% | <0.05% | <0.05% | 18 to 20% | 8 to 10.5% | | | | | BAL |
| High speed beads FHS | 1.3% | <0.5% | <0.5% | <0.05% | <0.05% | 3 to 5% | | 5% | 3% | 6% | 8% | BAL |

Ejection process

The ejection process to be performed is intermittent ejection in which ejection for 0.1 seconds to 1 second is repeated preferably at intervals of 0.5 seconds to 5 seconds and more preferably at intervals of 0.5 seconds to 1 second at an ejection pressure of 0.3 MPa or more.

The present invention will now be described in detail with reference to the drawings.

EXAMPLES

Blasting Machine

The fine-powder blasting machine used in Example 1 described later is a machine for blasting with abrasives in the form of fine powder. The fine powders here refer to abrasives with particle size of #240 to #3000 (average particle diameter of 4.7 μm to 87.5 μm) in terms of JIS standards (JIS R6001). Unlike the abrasives with a normal particle size, the fine powders here do not fall to the foot of the mountain, even if accumulated so as to form a conical mountain shape. Instead, in an extreme case, the fine powders here are so adhesive to one another that they can be accumulated at substantially a right angle. The fine-powder blasting machine is an ejector that basically has a similar structure to that of a known blasting machine; that is, it is constructed so that, on average, a constant amount of fine powder is supplied to the ejection nozzle by, for example, stirring and agitating the fine powder in the tank using an air vibrator.

The fine-powder blasting machine will be described by way of a gravity blasting machine 30 in FIG. 1.

The blasting machine 30 is provided with a nozzle 32 for ejecting abrasive such as shot into a cabinet 31 equipped with a gate 35 through which a metal product serving as a workpiece W is introduced and discharged. A compressed-gas supply conduit 44 connected to this nozzle 32 communicates with a compressor (not shown) from which compressed air is supplied. A hopper 38 is provided at the lower portion of the cabinet 31. The lowest end of the hopper 38 communicates, through a conduit 43, with the upper side of a recovery tank 33 disposed at the upper side of the cabinet 31. The lower end of the recovery tank 33 communicates with the nozzle 32 through a shot supply conduit 41. The abrasive contained in the recovery tank 33 falls therefrom due to gravity or predetermined pressure, and is ejected into the cabinet 31 together with the compressed air supplied through the above-described compressed-gas supply conduit 44 to the nozzle 32.

The ejected abrasive and the dust generated at this time fall into the hopper 38 at the lower part of the cabinet 31, go up along the ascending air current generated in the conduit 43, and are sent to the recovery tank 33, where the abrasive is recovered. The dust in the recovery tank 33 is discharged from the upper end of the recovery tank 33 by an air stream in the recovery tank 33 and is introduced through a discharge conduit 42 to a dust collector (not shown) where the dust is collected at the bottom thereof. Then, clean air is discharged through a ventilator (not shown) disposed at the upper portion of the dust collector (not shown).

Example 1

Blasting was applied to a metal product, i.e., a needle roller for speed reducers, 4 mm in diameter and 50 mm in length. The blasting machine and blasting conditions for this machine of the Example 1 are shown in Table 4-1.

TABLE 4-1

| EXAMPLE 1 | | | | |
|---|---|---|---|---|
| Blasting machine | Blasting machine for SC fine powder (gravity type) | | | |
| Metal product (mm) | Needle roller for speed reducer (φ4, 50 L) | | | |
| Material of metal product | SUJ (high carbon-chromium bearing steel) | | | |
| Ejection pressure | 0.45 MPa | | | |
| Diameter of ejection nozzle | 9 mm (nozzle movement: 60 movements/min; move width: 100 mm/min) | | | |
| Ejection speed | 150 m/sec | | | |
| Ejection distance | 200 mm | | | |
| Treatment time | 400 products per 15 min (barrel: 4.8 rotations/min) | | | |
| Non-ejection interval | 0.5 sec | | | |
| Ejection time of intermittent ejection per one time | 0.5 sec | | | |
| Shot material | Alumina-silica beads | | | |
| Shot particle size | #300 to #400 (63 μm to 38 μm) | | | |
| Shot hardness | About 800 Hv | | | |
| Shot distribution | Particle size (μm) | 63 to 58 | 58 to 44 | 44 to 38 |
| | Mixing ratio | 1 | 1 | 1 |

Mixing ratio is expressed in weight ratio. (Volume ratio is substantially the same. Also applies to the following tables.)

Comparative Example 1

In Comparative Example 1, a single type of shot, that is, alumina-silica beads with a particle size of #300 (average particle diameter: 63 μm to 52 μm) was used to perform continuous ejection processing. The ejection was performed by a fixed nozzle (the other conditions were the same as those in Example 1). The blasting machine and blasting conditions for this machine of the Comparative Example 1 are shown in Table 4-2.

TABLE 4-2

| COMPARATIVE EXAMPLE 1 | |
|---|---|
| Blasting machine | Blasting machine for SC fine powder (gravity type) |
| Metal product (mm) | Needle roller for speed reducer (φ4, 50 L) |
| Material of metal product | SUJ (high carbon-chromium bearing steel) |
| Ejection pressure | 0.45 MPa |
| Diameter of ejection nozzle | 9 mm (fixed nozzle) |
| Ejection speed | 150 m/sec |
| Ejection distance | 200 mm |
| Treatment time | 400 products per 15 min (barrel: 4.8 rotations/min) |
| Non-ejection interval | None (Continuous ejection) |
| Shot material | Alumina-silica beads |
| Shot particle size | #300 (63 μm to 52 μm) |
| Shot hardness | About 800 Hv |

In Comparative Example 1, the nozzle is fixed, thus shots are ejected onto the same portion more than one second. Therefore, heat is held at the portion where the shots are ejected, accordingly it is impossible to rapidly cool the portion to normal temperature.

The recovery tank 33 contained abrasive in the form of shot composed of alumina-silica beads with a hardness of about 800 Hv which was higher than the hardness of the base metal of the needle roller for speed reducers serving as the workpiece W. This shot was a mixture of three or more different particle sizes within a range of JIS abrasive particle sizes from #300 to #400 (average particle diameter: 63 μm to 38 μm) at the mixing ratio listed in Table 4-1. This abrasive was almost perfectly spherical, and the closer to a perfect sphere it was, the more effective it was.

Four hundred metal products, i.e., needle rollers for speed reducers, were delivered from the gate 35 into a barrel (container or bath) in the cabinet 31, this barrel was rotated at a rotational speed of 4.8 rotations per minute, and the above-described mixed shot was ejected from the nozzle 32 onto the needle rollers for speed reducers inversely rotating in the barrel at an ejection pressure of 0.45 MPa, an ejection speed of 150 m/sec, and an ejection distance of 200 mm.

The barrel was a basket-shaped container, octagonal in cross section. At the time of ejection, the nozzle 32 was moved. This movement of the nozzle was performed as follows: the nozzle was reciprocated perpendicular to the ejection direction at an amplitude of 100 mm/minute, and this movement was performed at a frequency of 60 movements/minute, assuming that one reciprocation of the nozzle was one movement. Movement of the nozzle, moving speed of the nozzle, rotation of the barrel and rotational speed of the barrel result in intermittent ejection.

For this ejection, 0.5 seconds of ejection was repeated intermittently at intervals of 0.5 seconds in Example 1. In case of a cemented carbide tip, the cemented carbide tip is fixed on a jig, then such intermittent ejection can be performed with known technologies, such as by automatic control with a timer mechanism for controlling the opening/closing operation of an electromagnetic valve (not shown in the figure) provided in the compressed-gas supply conduit 44 communicating from the above-described compressor (not shown in the figure) to the nozzle 32.

The temperatures near the surfaces at sliding portions of the needle rollers for speed reducers subjected to blasting under the above-described conditions increased. Numerous micro-concavities substantially arc-shaped in cross section in various sizes from relatively large ones to small ones were randomly formed in the surfaces at the sliding portions of the metal products; and the crystal grains constituting the structures of the surface layers at the sliding portions were uniformly miniaturized down to the nano-size level, thereby achieving structures with high internal stress, high hardness, and high toughness.

Example 1 indicated satisfactory results as is known from the comparison (Table 4-3) between Example 1 and Comparative Example 1 discussed later. In summary, the shot speed after shot collision decreased though the degree of decrease in shot speed between before and after shot collision depended on the hardness of the metal product and the shot. According to the law of conservation of energy, most of the energy produced by the decrease in shot speed is converted into heat energy and the rest is converted into sound energy. The heat energy was probably attributable to the internal friction resulting from the collision portion being deformed at the time of collision, and the metal products partially became hot because heat exchange occurred at only portions deformed as a result of shot collision.

In other words, the temperature increased locally near the surface of each metal product because the weight of the portion exhibiting increased temperature due to deformation as a result of collision of shot onto the surface of the metal product was very small relative to the whole weight of the metal product, though the weight of such a portion increased in proportion to the speed of the shot before collision.

In the case of Example 1, the temperature of the surface layer at the sliding portion of each metal product instantaneously increased due to an impact force with high ejection density of shot with a mixture of three or more different particle sizes, even with one second or less of ejection, causing the temperature of the metal product composed of iron-carbon steel, such as high carbon-chromium steel, to reach or exceed the A3 transition point of the base metal. As a result, numerous micro-concavities in various sizes from relatively large ones to small ones in diameter were randomly formed in the surface at the sliding portion of the metal product as a result of substantially spherical shot with a mixture of three or more different particle sizes colliding with the metal structure of the surface layer at the sliding portion. The metal surface which was heated was instantaneously cooled while non ejection intervals, miniaturizing the coarse structures in the surface layer down to the nano-size level, and furthermore, the metal surface came to have a structure with high internal stress, high hardness, and high toughness, due to formation of the above-described concavities. In addition, because the entire treated surface was repeatedly subjected to instantaneous rapid heating and rapid cooling by repeated intermittent ejection with such high ejection density, the structures in the surface layer were uniformly miniaturized down to the nano-size level.

Figure 2:
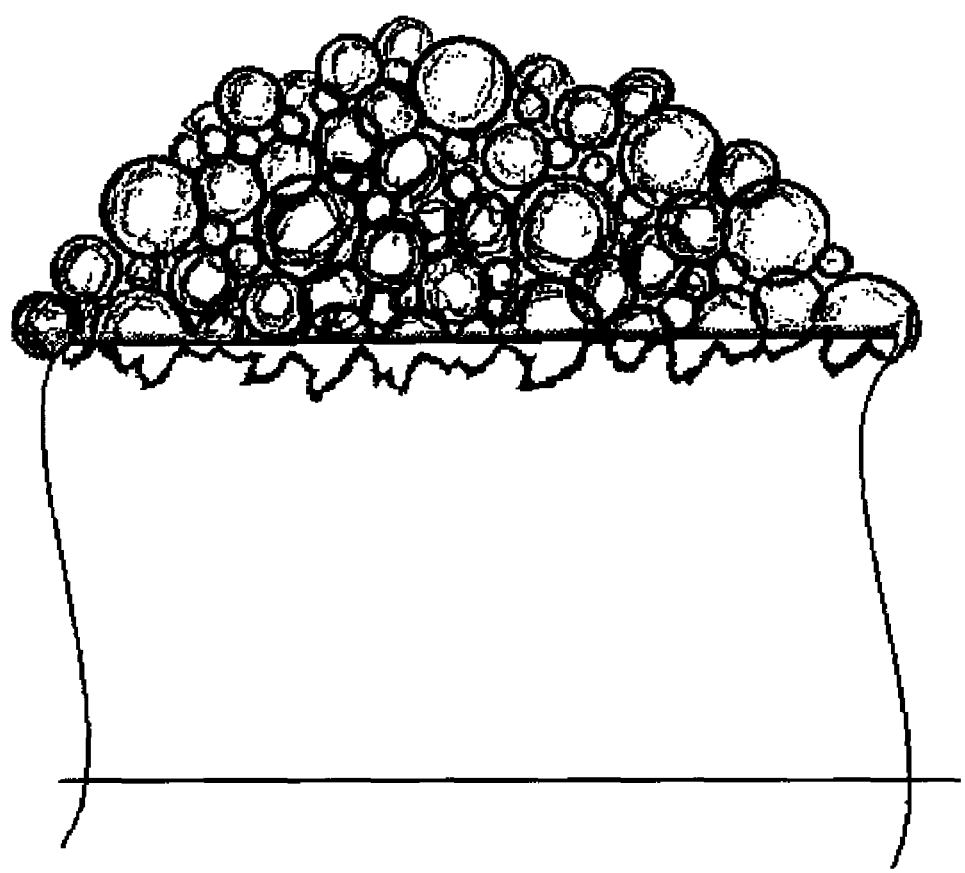
FIG. 2 is a cross-sectional schematic diagram showing shot colliding amid blasting treatment according to the present invention.
Figure 3:
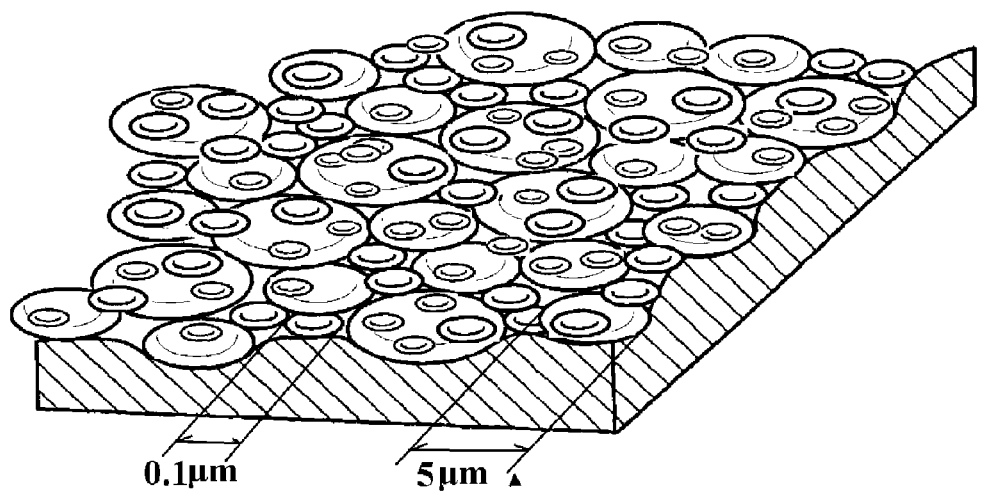
FIG. 3 is a schematic diagram showing the shapes of dimples in the surface of a treated product subjected to blasting treatment according to the present invention.
Figure 5:
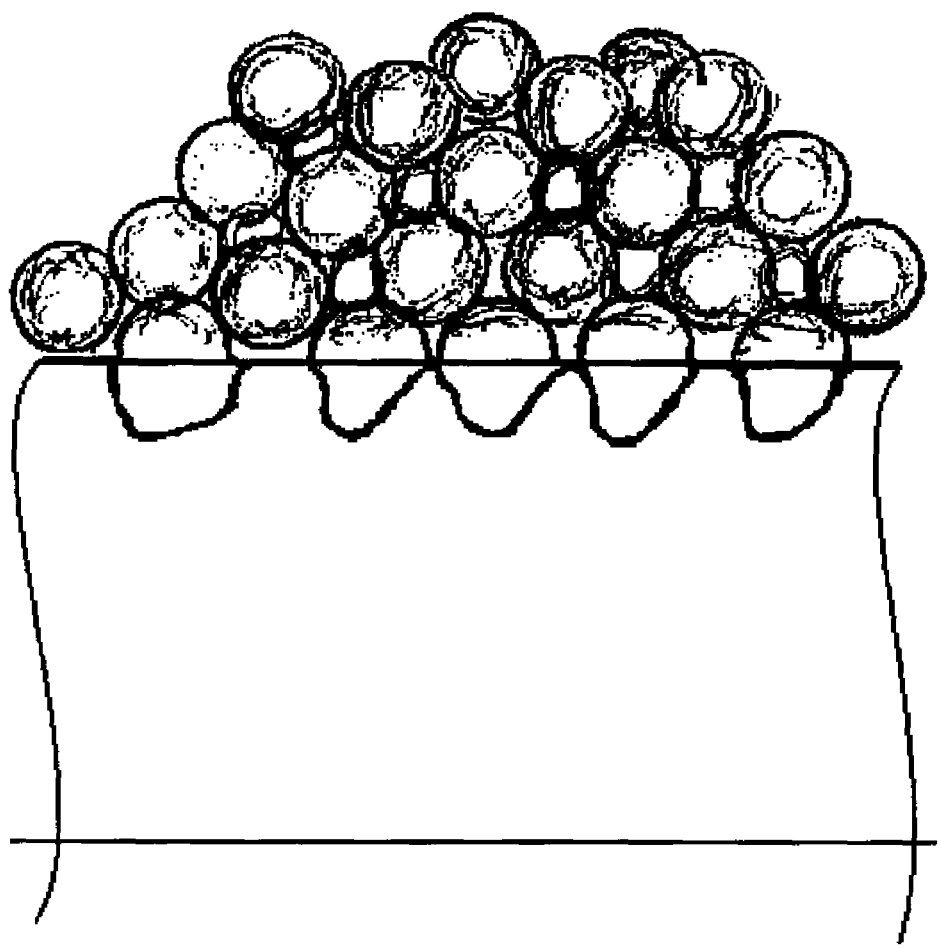
FIG. 5 is a cross-sectional schematic diagram showing shot colliding amid blasting in Comparative Example 1.
Figure 6:
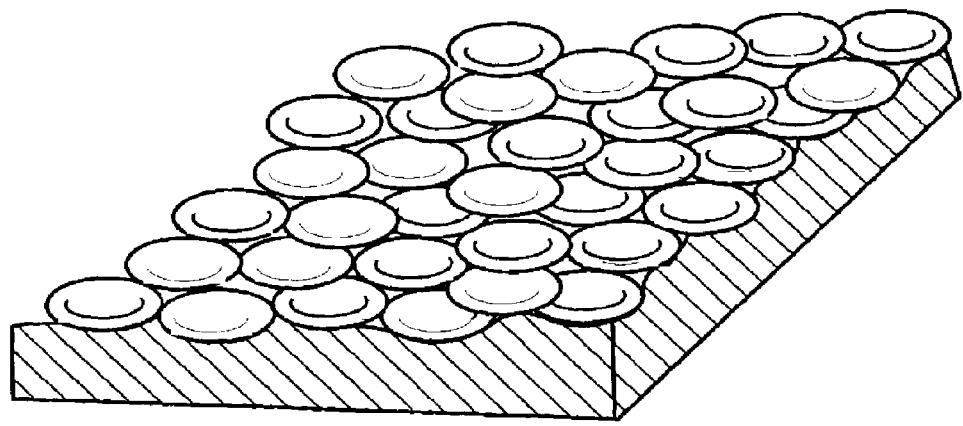
FIG. 6 is a schematic diagram showing the shapes of dimple surfaces of the treated product subjected to blasting in Comparative Example 1.

FIG. 2 is a cross-sectional view showing shot colliding with the surface discussed in Example 1, and FIG. 3 shows the shapes of dimples formed in the surface discussed in Example 1 after the shot was ejected. FIG. 5 is a cross-sectional view showing shot colliding with the surface discussed in Comparative Example 1, and FIG. 6 shows the shapes of dimples formed in the surface discussed in Comparative Example 1 after the shot was ejected.

The comparison between Example 1 and Comparative Example 1 indicates that the treatment in Example 1 performed by ejecting shot with a mixture of three or more different particle sizes exhibited a higher ejection density than the treatment in Comparative Example 1. This high ejection density in Example 1 was achieved because shot with a relatively small particle size enters between shot with a relatively large particle size.

As described above, collision with high ejection density by ejecting shot with a mixed distribution of three or more JIS abrasive particle sizes causes the outermost surface to be instantaneously heated. Instantaneous rapid heating and rapid cooling is repeated by performing ejection of mixed shot in this manner for one second or less, at non-ejection intervals of 0.5 seconds to 5 seconds, more preferably at non-ejection intervals of 0.5 seconds to 1 second, making it possible to uniformly nano-crystallize the surface structures.

Figure 4:
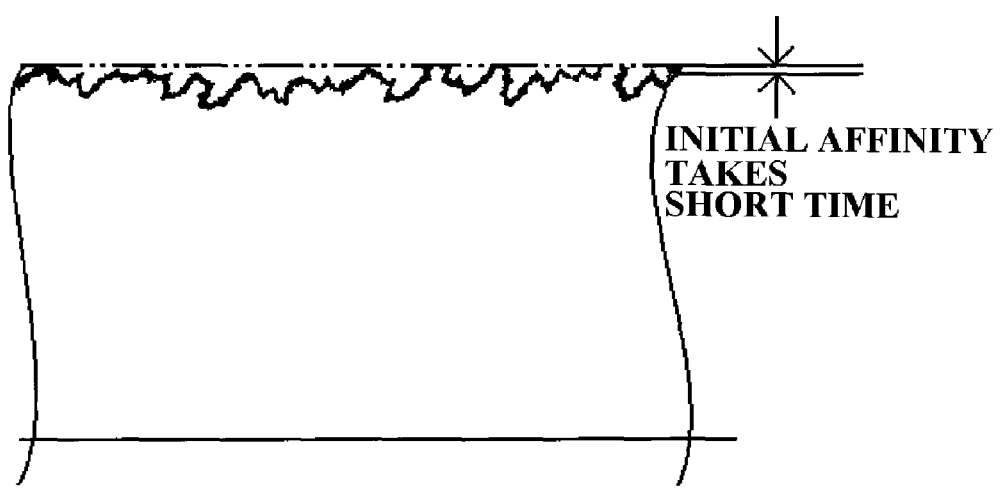
FIG. 4 is a cross-sectional schematic diagram of a treated product subjected to blasting treatment according to the present invention.
Figure 7:
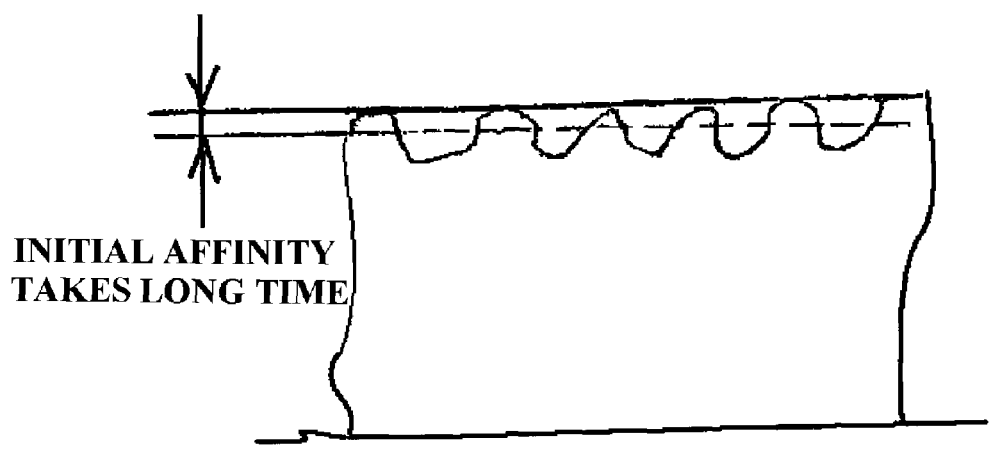
FIG. 7 is a cross-sectional schematic diagram of a treated product subjected to blasting in Comparative Example 1.

FIG. 4 is a cross-sectional view after shot blasting onto the surface discussed in Example 1, and FIG. 7 is a cross-sectional view after shot blasting onto the surface discussed in Comparative Example 1.

The comparison between Example 1 and Comparative Example 1 indicates that numerous micro-concavities (mixed micro-dimples) substantially arc-shaped in cross section in various sizes from relatively large ones to small ones were randomly formed in the surface in Example 1, and that the surface roughness in Example 1 was improved compared with that of Comparative Example 1. Formation of the above-described mixed micro-dimples was achieved by ejecting shot with a mixed distribution of three or more JIS abrasive particle sizes.

Figure 8:
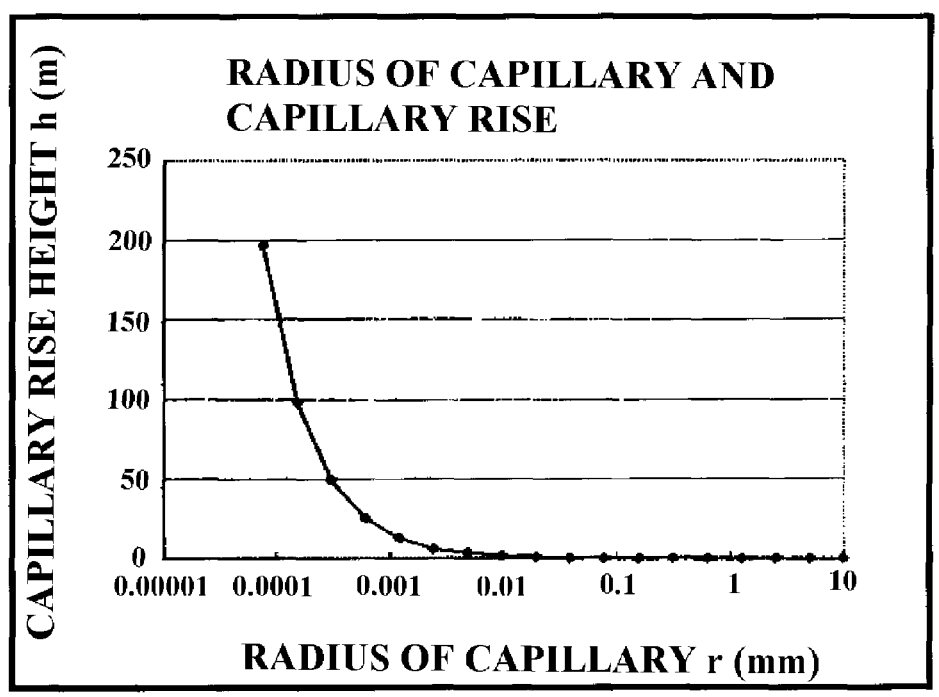
FIG. 8 is a graph showing the relationship between the radius of a capillary and the capillary rise.

FIG. 3 also shows that numerous micro-concavities substantially arc-shaped in cross section in various sizes from relatively large ones to small ones were randomly formed in the surface in Example 1, and that these concavities had substantially circular long sides and diameters of 0.1 μm to 5 μm. Regarding the capillary action of the dimples discussed later, the height that liquid goes up along a capillary by capillary action is inversely proportional to the radius of the capillary, as shown in the graph of FIG. 8. In particular, the liquid goes up dramatically when the radius of the capillary ranges from 1 μm to 0.1 μm.

Furthermore, the surface roughness in Example 1 was improved compared with Comparative Example 1 probably because a grinding effect was exerted due to peening by small beads of the mixed shot, resulting in a superior surface layer. Rapid repeated ejection of shot at regular intervals also prevented the surface from being damaged excessively, which partially contributed to the improvement in roughness.

Now, the effect of the dimples formed in Example 1 will be described below in detail. When lubricating oil is applied to a metal surface in which numerous micro-concavities, substantially arc-shaped in cross section are formed, due to surface tension, the lubricating oil normally forms oil droplets on the surface at each of the concavities that are arc-shaped in cross section. Because numerous fine concavities that are arc-shaped in cross section are formed in the metal surface, adjacent oil droplets at the concavities link with one another, thus forming a stable oil film as a whole on the entire sliding portion.

However, the higher the surface roughness and the lower the viscosity of the lubricating oil, the more easily the lubricating oil flows out of the concavities due to the surface pressure applied to the surface at the time of sliding, thus preventing the oil film from being maintained.

In contrast, the surface roughness in Example 1 was improved compared with the Comparative Example 1, and furthermore, because the capillary action was exerted upon the small micro-dimples from among the large to small mixed micro-dimples formed in the surface in Example 1, the oil film of lubricating oil could be maintained for an extended period of time. Therefore, in the Example 1, the lubricating oil was prevented from flowing out of the concavities even though surface pressure was applied by sliding the sliding portion. This prevented the oil film from easily running out even in the case of long-term sliding of the sliding portion.

Furthermore, because the surface roughness was improved and the surface layer was microstructured in a uniform and robust way in Example 1, the above-described initial affinity was completed in a short period of time. Therefore, the size did not change significantly, the accuracy was high, the efficiency was high, and the above-described mixed micro-dimples did not disappear due to wear.

On the other hand, the surface in Comparative Example 1 was rough, compared with Example 1, as is apparent by comparison between FIG. 4 and FIG. 7. Furthermore, unlike Example 1, mixed micro-dimples from large to small ones were not formed in Comparative Example 1, and capillary action of small micro-dimples from among the mixed micro-dimples could not be obtained. Therefore, when surface pressure was applied by sliding the surface, the lubricating oil flowed out of the concavities due to decreased oil viscosity, causing the oil film to run out, easily leading to a knocking sound and wringing.

Furthermore, as is apparent from the comparison between FIG. 2 and FIG. 5, ejection of shot with a single particle size as in Comparative Example 1 could not achieve a satisfactorily high ejection density, and large crystal grains remained in regions that could not be heated above the recrystallization temperature even though some local regions could be heated above the recrystallization temperature. In addition, because shot was ejected continuously in Comparative Example 1, some of the structures of the treated surface, even though they were heated above the recrystallization temperature, were not subjected to instantaneous rapid cooling. This caused crystal grains newly generated due to recrystallization during cooling to grow large. Therefore, part of the treated surface in Comparative Example 1 was not recrystallized because it was not subjected to instantaneous rapid heating and rapid cooling, causing large crystal grains to remain in such parts. This means that the entire surface structure was not nano-crystallized stably and uniformly.

From the descriptions so far, because the strength of the surface structure was low, and the surface was rough as described above, in Comparative Example 1, not only did a large size change result due to the initial affinity but also the accuracy became low. Furthermore, the efficiency was also low because a longer time is required for the initial affinity. In addition, when the dimples were deformed due to wear and disappeared over time because the surface structure was not robust, it became more difficult to maintain the oil film.

The effectiveness of the treatment in Example 1 is also apparent by comparing the needle rollers for speed reducers between Comparative Example 1 and Example 1. The comparison between the two is shown in Table 4-3.

The treatment carried out under the conditions of Example 1 (Table 4-1) is compared with the treatment carried out under the conditions of Comparative Example 1 where shot with a single particle size with a particle size of #300 (average particle diameter: 63 μm to 52 μm) was used and continuous ejection was carried out instead of repeated ejection at predetermined intervals (the other conditions were the same as those in Example 1). Although the structures in the surface layers at the sliding portions were miniaturized in both Example 1 and Comparative Example 1, the structures in the surface layer in Example 1 were uniformly miniaturized down to the nano-size level, whereas the structures in Comparative Example 1 were not miniaturized uniformly. Although micro-concavities (dimples) were formed in the surfaces in both Example 1 and Comparative Example 1, numerous micro-concavities in various sizes from relatively large ones to small ones from 0.1 μm to 0.5 μm in diameter were randomly formed, and furthermore, the surface roughness was improved in Example 1. A result of comparison between the Comparative Example 1 and the Example 1 is shown in Table 4-3.

TABLE 4-3

RESULT OF COMPARISON BETWEEN COMPARATIVE EXAMPLE 1 AND EXAMPLE 1

|  | Comparative Example 1 | Example 1 |
|---|---|---|
| Surface roughness (Ra) | 0.2 μm to 0.1 μm | 0.15 μm to 0.08 μm |
| Surface hardness | 1,100 Hv | 1,200 Hv |
| Surface internal stress | 1,350 MPa | 1,400 MPa |
| Abrasion test time | 200 hours | 400 hours |
| Abrasion test result | Sign of wear | No sign of wear |

For the abrasion test method, the resulting metal products respectively obtained in Comparative Example 1 and Example 1 were set on an actual machine and rotated at a rotational speed of 3,800 rpm. The lubricating oil used was machine oil with low viscosity.

From the results of the abrasion test in Table 4-3, it was found that the surface roughness was improved in Example 1; the surface hardness and the surface internal stress were higher in Example 1 than in Comparative Example 1; and abnormal wear was found after 200 hours of abrasion in Comparative Example 1, whereas no wear was found after 400 hours of abrasion in Example 1. In summary, these results indicate that in Example 1, a uniform nano-crystal structure reinforced the surface; the shapes of the mixed micro-dimples were maintained even after long-term abrasion; and furthermore, the oil film was maintained for an extended period of time by the capillary action of the relatively small dimples from among the mixed micro-dimples.

In contrast, in Comparative Example 1, because not only was the surface rough but also the capillary action of fine dimples could not be generated, the oil film on the surface could not be maintained when machine oil with low viscosity was used. In addition, because not only was the ejection density limited but also repeated ejection at predetermined intervals was not performed in Comparative Example 1, part of the treated surface in Comparative Example 1 was not recrystallized because it was not subjected to instantaneous rapid heating and rapid cooling. Therefore, large crystal grains remained, the entire surface structure was not miniaturized stably and uniformly, and the surface structures were not robust. For these reasons, the shapes of the dimples were worn, and the oil film was not maintained, resulting in abnormal wear.

The increase in oil temperature in Example 1 was 5° C. smaller, and sound during the test was lower than in Comparative Example 1. These results also indicate that not only was heat generation due to initial affinity moderate but also the shapes of the mixed micro-dimples were maintained until the end of the test in Example 1, maintaining the oil film.

The surface roughness in Example 1 was improved more than the surface roughness of Comparative Example 1. Therefore, Example 1 was found to be sufficiently practical.

For other Examples, blasting machines and blasting treatment conditions for these machines are shown in the following tables, together with comparisons with Comparative Examples.

Example 2

In Example 2, a single step of blasting was applied to a metal product in the form of a machine tool, i.e., splined shaft, 50 mm in diameter and 600 mm in length. For ejection treatment, a turntable was rotated at a rotational speed of 12 rotations per minute in Example 2. The blasting machine and blasting conditions for this machine of the Example 2 are shown in Table 5-1.

Hereinafter the term "one direction" in tables means one reciprocation of the nozzle on an arbitrary straight trail of X-axis. In Example 2, ejection was performed in three directions at a 120 different degrees angle to the X-axis.

TABLE 5-1

| EXAMPLE 2 | | | | |
| --- | --- | --- | --- | --- |
| Blasting machine | Blasting machine for FDC fine powder (direct pressure type) | | | |
| Metal product (mm) | Splined shaft for machine tool (φ50, 600 L) | | | |
| Material of metal product | SCM (chromium molybdenum steel) | | | |
| Ejection pressure | 0.5 MPa | | | |
| Diameter of ejection nozzle | 5 mm (nozzle movement: 30 movements/min; move width: 300 mm) | | | |
| Ejection speed | 200 m/sec | | | |
| Ejection distance | 200 mm | | | |
| Treatment time | 2 min in one direction × 3 directions (turntable: 12 rotations/min) | | | |
| Non-ejection interval | 0.5 sec | | | |
| Ejection time of intermittent ejection per one time | 0.5 sec | | | |

TABLE 5-1-continued

| EXAMPLE 2 | | | | |
| --- | --- | --- | --- | --- |
| Shot material | High-speed beads | | | |
| Shot particle size | #300 to #400 (74 μm to 30 μm) | | | |
| Shot hardness | About 900 Hv | | | |
| Shot distribution | Particle size (μm) | 74 to 37 | 67 to 34 | 53 to 30 |
| | Mixing ratio | 1 | 1 | 1 |

On the other hand, in Comparative Example 2, high-speed beads with a single particle size #300 (average particle diameter: 74 μm to 53 μm) were used as shot, and continuous ejection treatment, instead of repeated ejection at predetermined intervals, was performed via two-step processing using a direct-pressure blasting machine and a gravity blasting machine. The blasting machine and blasting conditions for this machine of the Comparative Example 2 are shown in Table 5-2.

TABLE 5-2

| COMPARATIVE EXAMPLE 2 | |
| --- | --- |
| Blasting machine | Blasting machine for FDC fine powder (1st step: direct pressure type) Blasting machine for SC fine powder (2nd step: gravity type) |
| Metal product (mm) | Splined shaft for machine tool (φ50, 600 L) |
| Material of metal product | SCM (chromium molybdenum steel) |
| Ejection pressure | 0.5 MPa |
| Diameter of ejection nozzle | 5 mm (nozzle movement: 10 movements/min; move width: 300 mm) |
| Ejection speed | 200 m/sec |
| Ejection distance | 200 mm |
| Treatment time | 2 min in one direction × 3 directions (turntable: 3 rotations/min; 1st step) 2 min in one direction × 3 directions (turntable: 3 rotations/min; 2nd step) |
| Ejection time | 2 to 3 sec (continuous ejection) |
| Shot material | High-speed beads |
| Shot grain size | #300 (74 μm to 53 μm) |
| Shot hardness | About 900 Hv |

In the Comparative Example 2, the nozzle is moved at 10 movements/min, and the rotational speed of the turn table is 3 rotations/min, thus shots are ejected onto the same portion more than one second. Therefore, heat is held at the portion where the shots are ejected, accordingly it is impossible to rapidly cool the portion to normal temperature.

A result of comparison between the Comparative Example 2 and the Example 2 is shown in Table 5-3.

TABLE 5-3

| RESULT OF COMPARISON BETWEEN COMPARATIVE EXAMPLE 2 AND EXAMPLE 2 | | |
| --- | --- | --- |
| | Comparative Example 2 | Example 2 |
| Surface roughness (Ra) | 0.4 μm to 0.3 μm | 0.3 μm to 0.2 μm |
| Surface hardness | 1,400 Hv | 1,400 Hv |
| Surface internal stress | 1,350 MPa | 1,400 MPa |
| Abrasion test time | 300 hours | 400 hours |
| Abrasion test result | Sign of wear | No sign of wear |

For the abrasion test method, the resulting metal products respectively obtained in Comparative Example 2 and Example 2 were set on an actual machine and reciprocated by a distance of 300 mm at a rate of 800 mm/sec. Machine oil was used as the lubricating oil.

The results are shown in Table 5-3. Abnormal wear appeared on the surface of the splined shaft after 300 hours in Comparative Example 2, whereas no wear was found even after 400 hours in Example 2.

As described above, machine tools are required to operate quickly. In this abrasion test in which fast operation was employed, the initial affinity took a long time, and baking occurred in Comparative Example 2, thus leading to abnormal wear. On the other hand, the surface roughness in Example 2, in terms of Ra, was improved by 0.1 μm, compared with Comparative Example 2, allowing the initial affinity to complete in a shorter period of time. Furthermore, capillary action of micro-dimples was exerted in Example 2, preventing the oil film from running out. Furthermore, the structure of the outermost surface was miniaturized and densified in the Example more than in the Comparative Example, which probably contributed to an increase in abrasion resistance.

Example 3

In Example 3, blasting was applied to an engine gear, 100 mm in diameter and 30 mm in thickness. For ejection treatment, a turntable was rotated at a rotational speed of 6 rotations per minute. The blasting machine and blasting conditions for this machine of the Example 3 are shown in Table 6-1.

TABLE 6-1

EXAMPLE 3

| | | | | |
|---|---|---|---|---|
| Blasting machine | Blasting machine for FDC fine powder (direct pressure type) | | | |
| Metal product (mm) | Engine gear (φ100, 30 t) | | | |
| Material of metal product | SNCM (nickel-chromium-molybdenum steel) | | | |
| Ejection pressure | 0.5 MPa | | | |
| Diameter of ejection nozzle | 5 mm (nozzle movement: 60 movements/min; move width: 50 mm) | | | |
| Ejection speed | 200 m/sec | | | |
| Ejection distance | 200 mm | | | |
| Treatment time | 2 min in one direction × 3 directions (turntable: 6 rotations/min) | | | |
| Non-ejection interval | 0.5 sec | | | |
| Ejection time of intermittent ejection per one time | 0.5 sec | | | |
| Shot material | High-speed beads | | | |
| Shot particle size | #180 to #400 (105 μm to 30 μm) | | | |
| Shot hardness | About 900 Hv | | | |
| Shot distribution | Particle size (μm) | 105 to 53 | 74 to 37 | 53 to 30 |
| | Mixing ratio | 1 | 1 | 1 |

On the other hand, two-step processing was performed in Comparative Example 3: a direct-pressure blasting machine was used with steel beads with a particle size of #300 (average particle diameter: 74 μm to 53 μm) at a pressure of 0.5 MPa in the first step and a gravity blasting machine was used with alumina-silica beads with a particle size of #300 (average particle diameter: 63 μm to 52 μm) at a pressure of 0.5 MPa in the second step. Continuous ejection treatment was performed, instead of repeated ejection at predetermined intervals. The blasting machine and blasting conditions for this machine of the Comparative Example 3 are shown in Table 6-2.

TABLE 6-2

COMPARATIVE EXAMPLE 3

| | |
|---|---|
| Blasting machine | Blasting machine for FDC fine powder (1st step: direct pressure type) Blasting machine for SC fine powder (2nd step: gravity type) |
| Metal product (mm) | Engine gear (φ100, 30 t) |
| Material of metal product | SNCM (nickel-chromium-molybdenum steel) |
| Ejection pressure | 0.5 MPa |
| Diameter of ejection nozzle | 5 mm (nozzle movement: 30 movements/min; move width: 50 mm) |
| Ejection speed | 200 m/sec |
| Ejection distance | 200 mm |
| Treatment time | 2 min in one direction × 3 directions (turntable: 3 rotations/min; 1st step) 2 min in one direction × 3 directions (turntable: 3 rotations/min; 2nd step) |
| Ejection time | 2 to 3 sec (continuous ejection) |
| Shot materials | Steel beads #300 (1st step) Alumina-silica beads #300 (2nd step) |
| Shot particle size | Steel beads #300 (74 μm to 53 μm) Alumina-silica beads #300 (63 μm to 52 μm) |
| Shot hardness | Steel beads: About 700 Hv Alumina-silica beads: About 800 Hv |

In the Comparative Example 3, the nozzle is moved at 30 movements/min and the rotational speed of the turn table is 3 rotations/min, thus shots are ejected onto the same portion more than one second. Therefore, heat of the portion where the shots are ejected is held, accordingly it is impossible to rapidly cool the portion to normal temperature.

A result of comparison between the Comparative Example 3 and the Example 3 is shown in Table 6-3.

TABLE 6-3

RESULT OF COMPARISON BETWEEN COMPARATIVE EXAMPLE 3 AND EXAMPLE 3

| | Comparative Example 3 | Example 3 |
|---|---|---|
| Surface roughness (Ra) | 0.4 μm to 0.3 μm | 0.4 μm to 0.3 μm |
| Surface hardness | 1,200 Hv | 1,300 Hv |
| Surface internal stress | 1,500 MPa | 1,500 MPa |
| Abrasion test time | 100 hours | 200 hours |
| Abrasion test result | Sign of wear | No sign of wear |

For this abrasion test method, the resulting metal products respectively obtained in Comparative Example 3 and Example 3 were set on an actual engine and rotated at a rotational speed of 6,000 rpm. The lubricating oil used was transmission oil having lower viscosity than that of known oil.

Pitting occurred on the surface and wear was found after 100 hours in Comparative Example 3, whereas there was no sign of pitting or wear even after 200 hours in Example 3. Considering that fine mixed micro-dimples after initial affinity remained in the surface in Example 3, capillary action was presumed to occur, thereby preventing the oil film from running out.

Example 4

In Example 4, blasting was applied to a pressure-regulating valve, φ20 mm and 3 mm in thickness. In Example 4, blasting was performed after grinding. For ejection, a turntable was rotated at a rotational speed of 40 rotations per minute. The blasting machine and blasting conditions for this machine of the Example 4 are shown in Table 7-1.

TABLE 7-1

EXAMPLE 4

| | |
|---|---|
| Blasting machine | Blasting machine for SC fine powder (gravity type) |
| Metal product (mm) | Pressure-regulating valve (φ20, 3 t) |
| Material of metal product | SUS304 (stainless steel) |
| Ejection pressure | 0.3 MPa |
| Diameter of ejection nozzle | 9 mm (nozzle fine movement: 30 movements/min) |
| Ejection speed | 180 m/sec |
| Ejection distance | 150 mm |
| Treatment time | 10 sec (φ20 mm) (turntable: 40 rotations/min) |
| Non-ejection interval | 0.5 sec |
| Ejection time of intermittent ejection per one time | 0.5 sec |
| Shot material | Alumina-silica beads |
| Shot particle size | #300 to #400 (63 μm to 38 μm) |
| Shot hardness | About 800 Hv |

| Shot distribution | | | | |
|---|---|---|---|---|
| | Particle size (μm) | 63 to 58 | 58 to 44 | 44 to 38 |
| | Mixing ratio | 1 | 1 | 1 |

On the other hand, in Comparative Example 4, a pressure-regulating valve same as Example 4 is ground then lapped by a lapping machine.

A result of comparison between the Comparative Example 4 and the Example 4 is shown in Table 7-2.

TABLE 7-2

RESULT OF COMPARISON BETWEEN COMPARATIVE EXAMPLE 4 AND EXAMPLE 4

| | Comparative Example 4 | Example 4 |
|---|---|---|
| Surface roughness (Ra) | 0.1 μm | 0.2 μm |
| Surface hardness | 350 Hv | 500 Hv |
| Surface internal stress (MPa) | 300 MPa | 500 MPa |
| No. of abrasion tests | 100,000 | 100,000 |
| Abrasion test result | Sign of wear | No sign of wear |

It is already known from the results of the abrasion test in Comparative Example 4 that there was a problem with the service life and a problem of malfunctions due to crevice corrosion under a severe environment. Wear occurred after 100,000 tests in this Comparative Example 4. Wear did not occur after 100,000 tests in Example 4. Subsequently, another 1,000,000 tests were conducted in Example 4, and no wear occurred. The responsiveness was superior and sound was lower in Example 4 than in Comparative Example 4. A CASS (copper accelerated acetic acid salt spray) test (in accordance with JIS H8502 7.3) also demonstrated superior corrosion resistance. This indicates that the corrosion resistance increased as a result of the structures in the outermost surface being miniaturized.

Example 5

In Example 5, blasting was applied to a pudding mold, φ50 mm and 30 mm in height. For ejection, a turntable was rotated at a rotational speed of 12 rotations per minute. The blasting machine and blasting conditions for this machine of the Example 5 are shown in Table 8-1.

Example 5

TABLE 8-1

| | |
|---|---|
| Blasting machine | Blasting machine for SC fine powder (gravity type) |
| Metal product (mm) | Pudding mold (φ50, 30 h) |
| Material of metal product | SUS304 (stainless steel) |
| Ejection pressure | 0.4 MPa |
| Diameter of ejection nozzle | 9 mm (nozzle movement: 60 movements/min; move width: 50 mm) |
| Ejection speed | 150 m/sec |
| Ejection distance | 200 mm |
| Treatment time | Inner diameter 30 sec × 3 directions |
| Non-ejection interval | 0.5 sec |
| Ejection time of intermittent ejection per one time | 0.5 sec |
| Shot material | Alumina-silica beads |
| Shot particle size | #300 to #400 (63 μm to 38 μm) |
| Shot hardness | About 800 Hv |

| Shot distribution | | | | |
|---|---|---|---|---|
| | Particle size (μm) | 63 to 58 | 58 to 44 | 44 to 38 |
| | Mixing ratio | 1 | 1 | 1 |

On the other hand, in Comparative Example 5, a pudding mold same as Example 5 is polished by hand. A result of comparison between the Comparative Example 5 and the Example 5 is shown in Table 8-2.

TABLE 8-2

RESULT OF COMPARISON BETWEEN COMPARATIVE EXAMPLE 5 AND EXAMPLE 5

| | Comparative Example 5 | Example 5 |
|---|---|---|
| Surface roughness (Ra) | 0.1 μm | 0.3 μm |
| Surface hardness | 350 Hv | 500 Hv |
| Surface internal stress | 300 MPa | 500 MPa |
| Abrasion test time | 5,000 hours | 10,000 hours |
| Abrasion test result | Mold releasability is low | Good |

In Comparative Example 5, there was no problem for a while after the initial affinity, however, defective molds were found, showing degraded mold releasability some time later, terminating the service lives of the molds. In Example 5, the mold releasability was superior from the beginning: the mold releasability and the corrosion resistance were superior even after a period of time twice as long as that for the molds treated conventionally had elapsed. Example 5 exhibited superior results by blasting alone without grinding.

Example 6

In Example 6, blasting was applied to a stainless-steel bolt M8(JIS) with a length of 20 mm which is manufactured by metal rolling. For ejection, a barrel basket was rotated at a rotational speed of 4.8 rotations per minute. The blasting machine and blasting conditions for this machine of the Example 6 are shown in Table 9-1.

TABLE 9-1

EXAMPLE 6

| | |
|---|---|
| Blasting machine | Blasting machine for FDC fine powder (direct pressure type) |
| Metal product (mm) | Hexagon head bolt manufactured by metal rolling (M8; JIS B 1180-1995; JIS B 1181-1995, 20 L) |
| Material of metal product | SUS304 (stainless steel) |
| Ejection pressure | 0.5 MPa |
| Diameter of ejection nozzle | 5 mm (nozzle movement: 60 movements/min; move width: 100 mm) |
| Ejection speed | 200 m/sec |
| Ejection distance | 200 mm |
| Treatment time | 300 products/15 min, rotation of barrel basket (4.8 rotations/min) |
| Non-ejection interval | 0.5 sec |
| Ejection time of intermittent ejection per one time | 0.5 sec |
| Shot material | SUS304 (stainless steel) |
| Shot particle size | #150 to #300 (125 μm to 37 μm) |
| Shot hardness | About 600 Hv |

| Shot distribution | Particle size (μm) | 125 to 63 | 105 to 53 | 74 to 37 |
|---|---|---|---|---|
| | Mixing ratio | 1 | 1 | 1 |

On the other hand, a stainless-steel bolt M8(JIS) with a length of 20 mm manufactured only by metal rolling was used in Comparative Example 6.

A result of comparison between the Comparative Example 6 and the Example 6 is shown in Table 9-2.

TABLE 9-2

RESULT OF COMPARISON BETWEEN COMPARATIVE EXAMPLE 6 AND EXAMPLE 6

| | Comparative Example 6 | Example 6 |
|---|---|---|
| Surface roughness (Ra) | 0.3 μm | 0.3 μm |
| Surface hardness | 400 Hv | 500 Hv |
| Surface internal stress | 400 MPa | 500 MPa |
| Corrosion test time | One year | One year |
| Corrosion test result | Sign of rust | No sign of rust |

The stainless-steel bolt of Comparative Example 6 which is conventionally manufactured by metal rolling and the stainless-steel bolt of Example 6 to which blasting was applied as mentioned above were used for outdoor stainless-steel pumps. About one year later, when an attempt was made to disassemble the stainless-steel pumps for maintenance, it was difficult to disassemble the stainless-steel pump by loosening the stainless-steel bolt manufactured by metal rolling alone in Comparative Example 6, because there was crevice corrosion on the pump. On the other hand, in Example 6, there was no rust one year later. After the completion of maintenance, the stainless-steel bolt was reusable. This indicates that the surface structures in Example 6 were miniaturized, improving the corrosion resistance.

Example 7

In Example 7, blasting was applied to a metal saw HSS, φ250 mm and 1 mm in thickness. For ejection, a turntable was rotated at a rotational speed of 3 rotations per minute. The blasting machine and blasting conditions for this machine of the Example 7 are shown in Table 10-1.

TABLE 10-1

EXAMPLE 7

| | |
|---|---|
| Blasting machine | SGK gravity blasting machine |
| Metal product (mm) | Metal saw HSS (φ250, 1 t) |
| Material of metal product | SKH |
| Ejection pressure | 0.4 MPa |
| Diameter of ejection nozzle | 9 mm (nozzle fine movement: 60 movements/min; move width: 20 mm) |
| Ejection speed | 150 m/sec |
| Ejection distance | 200 mm |
| Treatment time | 60 sec in one direction × 4 directions (turntable: 3 rotations/min) |
| Non-ejection interval | 0.5 sec |
| Ejection time of intermittent ejection per one time | 0.5 sec |
| Shot material | Alumina-silica beads |
| Shot particle size | #200 to #400 (90 μm to 38 μm) |
| Shot hardness | About 800 Hv |

| Shot distribution | Particle size (μm) | 90 to 63 | 63 to 45 | 53 to 38 |
|---|---|---|---|---|
| | Mixing ratio | 1 | 1 | 1 |

In Comparative Example 7, the ejection conditions were the same as those in Example 7, except that #300 (63 μm to 45 μm) alumina-silica beads were continuously ejected from a fixed nozzle. The blasting machine and blasting conditions for this machine of the Comparative Example 7 are shown in Table 10-2.

TABLE 10-2

COMPARATIVE EXAMPLE 7

| | |
|---|---|
| Blasting machine | SGK gravity blasting machine |
| Metal product (mm) | Metal saw HSS (φ250, 1 t) |
| Material of metal product | SKH |
| Ejection pressure | 0.4 MPa |
| Diameter of ejection nozzle | 9 mm (fixed nozzle) |
| Ejection speed | 150 m/sec |
| Ejection distance | 200 mm |
| Treatment time | 60 sec in one direction × 4 directions (turntable: 3 rotations/min) |
| Ejection time | Non (continuous ejection) |
| Shot material | Alumina-silica beads |
| Shot particle size | #300 (63 μm to 52 μm) |
| Shot hardness | About 800 Hv |

In Comparative Example 7, the nozzle is fixed, thus shots are ejected onto the same portion more than one second. Therefore, heat is held at the portion where the shots are ejected, accordingly it is impossible to rapidly cool the portion to normal temperature.

A result of comparison between the Comparative Example 7 and the Example 7 is shown in Table 10-3.

TABLE 10-3

RESULT OF COMPARISON BETWEEN COMPARATIVE EXAMPLE 7 AND EXAMPLE 7

| | Comparative Example 7 | Example 7 |
|---|---|---|
| Surface roughness (Ra) | 0.1 μm | 0.1 μm |
| Surface hardness | 1,200 Hv | 1,200 Hv |
| Surface internal stress | 1,400 MPa | 1,500 MPa |
| No. of endurance tests | 1,000 | 1,500 |
| Endurance test results | Cut surface was not slippery | Cut surface was clean and slippery |

An endurance test was conducted by cutting blades of a hydraulic pump made of high-speed steel (SKH). The cutting ability was lost after 1,000 blades were cut in Comparative Example 7, whereas it was possible to cut 1,500 blades in Example 7. Because there was only moderate wear at the blade edge, the number of re-grindings increased to three to four times higher. Removal of grinding burrs was superior in Example 7. Although the surface roughness in Example 7 was as good as that in Comparative Example 7, the internal stress of the surface in Example 7 was increased probably because the structures were miniaturized. Although no difference was seen in the surface roughness, the surface in Example 7 was felt to be smoother when the surface was checked by touch.

Example 8

In Example 8, blasting was applied to a drawing punch, φ20 mm and 200 mm in length. In Example 8, grinding was performed, followed by blasting, followed by paper lapping, and then PVD coating. For ejection, a turntable was rotated at a rotational speed of 12 rotations per minute. The blasting machine and blasting conditions for this machine of the Example 8 are shown in Table 11-1.

TABLE 11-1

| EXAMPLE 8 | |
| --- | --- |
| Blasting machine | SGK gravity blasting machine |
| Metal product (mm) | Drawing punch (φ20, 200 L) |
| Material of metal product | G6 carbide |
| Ejection pressure | 0.5 MPa |
| Diameter of ejection nozzle | 9 mm (nozzle movement: 60 movements/min; move width: 100 mm) |
| Ejection speed | 200 m/sec |
| Ejection distance | 150 mm |
| Treatment time | 20 sec in one direction × 2 directions (turntable: 12 rotations/min) |
| Non-ejection interval | 0.5 sec |
| Ejection time of intermittent ejection per one time | 0.5 sec |
| Shot material | High-speed beads |
| Shot particle size | #300 to #400 (74 μm to 30 μm) |
| Shot hardness | About 900 Hv |
| Shot distribution — Particle size (μm) | 74 to 37    67 to 34    53 to 30 |
| Shot distribution — Mixing ratio | 1    1    1 |
| Others | After the blasting, paper lapping and PVD coating were performed. |

In Comparative Example 8, on the other hand, a drawing punch same as the Example 8 was ground by manual buffing, then paper-lapping was performed, followed by PVD coating.

A result of comparison between the Comparative Example 8 and the Example 8 is shown in Table 11-2.

TABLE 11-2

| RESULT OF COMPARISON BETWEEN COMPARATIVE EXAMPLE 8 AND EXAMPLE 8 | | |
| --- | --- | --- |
| | Comparative Example 8 | Example 8 |
| Surface roughness (Ra) | 0.05 μm | 0.08 μm |
| Surface hardness | 1,400 Hv | 1,400 Hv |
| Surface internal stress | 230 MPa | 600 MPa |
| Abrasion test time | 30,000 | 330,000 |
| Abrasion test result | Sign of baking | Slight fusion only |

For an abrasion test, drawing was applied to a pipe. In Comparative Example 8, baking occurred after 30,000 pipes were processed, and the punch was abnormally worn. In Example 8, it was possible to process 330,000 pipes, causing only minor baking, and to reuse a weld after being re-ground, which contributed to significant cost reduction. Furthermore, considering that the internal stress of the surface increased to two times higher or more, the effect resulting from the carbide surface structure being miniaturized, the effect of adhesion to the coating, and the mixed micro-dimples uniformly formed in the surface probably had a great impact on oil retention ability of the lubricant longevity.

Thus the broadest claims that follow are not directed to a machine that is configured in a specific way. Instead, said broadest claims are intended to protect the heart or essence of this breakthrough invention. This invention is clearly new and useful. Moreover, it was not obvious to those of ordinary skill in the art at the time it was made, in view of the prior art when considered as a whole.

Moreover, in view of the revolutionary nature of this invention, it is clearly a pioneering invention. As such, the claims that follow are entitled to very broad interpretation so as to protect the heart of this invention, as a matter of law.

It will thus be seen that the objects set forth above, and those made apparent from the foregoing description, are efficiently attained and since certain changes may be made in the above construction without departing from the scope of the invention, it is intended that all matters contained in the foregoing description or shown in the accompanying drawings shall be interpreted as illustrative and not in a limiting sense.

It is also to be understood that the following claims are intended to cover all of the generic and specific features of the invention herein described, and all statements of the scope of the invention which, as a matter of language, might be said to fall therebetween.

Now that the invention has been described;

DESCRIPTION OF REFERENCE NUMERALS

30 Gravity blasting machine
31 Cabinet
32 Nozzle
33 Recovery tank
35 Gate
38 Hopper
41 Shot supply conduit
42 Discharge conduit
43 Conduit
44 Compressed-gas supply conduit

What is claimed is:

1. An instantaneous heat treatment method for a metal product, comprising:
   mixing substantially perfectly spherical shot having three or more approximate but different particle sizes within a range of #100 to #800 (average particle diameter: 149 μm to 20 μm), the shot having a hardness higher than the hardness of a base metal of a workpiece; and
   intermittently ejecting the shot in the form of a fluid mixed with compressed air onto the workpiece for a period of 0.1 seconds to 1 second, at intervals of 0.5 seconds to 5 seconds, at an ejection pressure of 0.3 MPa to 0.6 MPa, at an ejection speed of 100 m/sec to 200 m/sec, and at an ejection distance of 100 mm to 250 mm,
   thereby randomly forming numerous micro-concavities in a surface of the workpiece, each of the micro-concavities having a substantially circular bottom surface with diameter of 0.1 μm to 5 μm.

2. The instantaneous heat treatment method for a metal product according to claim 1, wherein the intermittent ejection is performed at intervals of 0.5 seconds to 1 second.

3. The instantaneous heat treatment method for a metal product according to claim 1, wherein the workpiece is formed to have a surface roughness (Ra) of 1 μm or less.

4. The instantaneous heat treatment method for a metal product according to claim 1, wherein the three or more approximate but different particle sizes of the shot are contained in the same proportions.

5. The instantaneous heat treatment method for a metal product according to claim 1, wherein the three or more approximate but different particle sizes of the shots are within a range of average particle diameter of 30 μm to 125 μm.

6. The instantaneous heat treatment method for a metal product according to claim 1, wherein the largest particle sizes of the three or more approximate but different particle sizes of the shots are average particle diameters of 63 μm, 58 μm, 44 μm, respectively.

7. The instantaneous heat treatment method for a metal product according to claim 1, wherein the largest particle sizes of the three or more approximate but different particle sizes of the shots are average particle diameters of 74 μm, 67 μm, 53 μm, respectively.

8. The instantaneous heat treatment method for a metal product according to claim 1, wherein the largest particle sizes of the three or more approximate but different particle sizes of the shots are average particle diameters of 105 μm, 74 μm, 53 μm, respectively.

9. The instantaneous heat treatment method for a metal product according to claim 1, wherein the largest particle sizes of the three or more approximate but different particle sizes of the shots are average particle diameters of 125 μm, 105 μm, 74 μm, respectively.

10. The instantaneous heat treatment method for a metal product according to claim 1, wherein the largest particle sizes of the three or more approximate but different particle sizes of the shots are average particle diameters of 90 μm, 63 μm, 53 μm, respectively.

* * * * *

UNITED STATES PATENT AND TRADEMARK OFFICE
CERTIFICATE OF CORRECTION

PATENT NO. : 8,893,538 B2
APPLICATION NO. : 13/293693
DATED : November 25, 2014
INVENTOR(S) : Yoshio Miyasaka Page 1 of 1

It is certified that error appears in the above-identified patent and that said Letters Patent is hereby corrected as shown below:

In the specification

Column 5, line 40, Please delete "$Ra = \frac{1}{l} \int_0^l |f(x)| dx$" and insert -- $Ra = \frac{1}{\ell} \int_0^\ell |f(x)| dx$ --

Signed and Sealed this
Twenty-first Day of July, 2015

Michelle K. Lee
*Director of the United States Patent and Trademark Office*